(12) United States Patent
Kasai

(10) Patent No.: US 7,553,169 B2
(45) Date of Patent: Jun. 30, 2009

(54) PRINTED CIRCUIT BOARD HAVING FUSE HOUSINGS AND ELECTRIC JUNCTION BOX FOR VEHICLE

(75) Inventor: Koji Kasai, Yokkaichi (JP)

(73) Assignee: Sumitomo Wiring Systems, Ltd., Yokkaichi-Mie (JP)

( * ) Notice: Subject to any disclaimer, the term of this patent is extended or adjusted under 35 U.S.C. 154(b) by 64 days.

(21) Appl. No.: 11/924,077

(22) Filed: Oct. 25, 2007

(65) Prior Publication Data

US 2008/0105460 A1   May 8, 2008

(30) Foreign Application Priority Data

Nov. 8, 2006   (JP)   ............................ 2006-302674

(51) Int. Cl.
    *H01R 12/00*   (2006.01)
(52) U.S. Cl. ...................................... 439/76.2; 439/949
(58) Field of Classification Search ................ 439/76.2, 439/949, 76.1
    See application file for complete search history.

(56) References Cited

U.S. PATENT DOCUMENTS

| | | | | |
|---|---|---|---|---|
| 5,478,244 | A * | 12/1995 | Maue et al. ................. | 439/76.2 |
| 5,622,507 | A   | 4/1997  | Kasai | |
| 5,928,004 | A * | 7/1999  | Sumida et al. ............. | 439/76.2 |
| 6,290,509 | B1  | 9/2001  | Hattori et al. | |
| 6,761,567 | B2* | 7/2004  | Onizuka et al. ............ | 439/76.2 |
| 6,905,347 | B2* | 6/2005  | Kobayashi .................. | 439/76.2 |
| 7,252,519 | B2* | 8/2007  | Saka ......................... | 439/76.2 |
| 7,320,608 | B2* | 1/2008  | Kubota et al. .............. | 439/76.1 |
| 7,335,035 | B2* | 2/2008  | Shirota ...................... | 439/76.2 |
| 7,390,198 | B2* | 6/2008  | Oka et al. .................. | 439/76.2 |
| 2006/0141822 | A1 | 6/2006 | Ozawa et al. | |
| 2006/0141824 | A1 | 6/2006 | Kubota et al. | |

FOREIGN PATENT DOCUMENTS

| | | |
|---|---|---|
| JP | 2006 6052 | 1/2006 |
| JP | 2006 187052 | 7/2006 |

OTHER PUBLICATIONS

English language Abstract of JP 2006-187052.
English language Abstract of JP 2006-6052.
U.S. Appl. No. 11/934,955 to Kasai, which was filed on Nov. 5, 2007.

* cited by examiner

*Primary Examiner*—Gary F. Paumen
(74) *Attorney, Agent, or Firm*—Greenblum & Bernstein, P.L.C.

(57) ABSTRACT

A printed circuit board having fuse housings that is mounted in an electric junction box for a vehicle, includes a fuse case that has fuse housings provided in a plurality of parallel tiers; output terminals that are formed of L-shaped terminals connected to and projecting from a printed conductor of the printed circuit board, and that project inside each of the fuse housing tiers; input terminals that are formed of L-shaped terminals branching from bus bars, and that project inside at least one of the fuse housing tiers; and a base that is mounted on a rear surface side of the fuse case and that holds the input and output terminals that are passed through the base.

18 Claims, 5 Drawing Sheets

PRINTED CIRCUIT BOARD HAVING FUSE HOUSINGS AND ELECTRIC JUNCTION BOX FOR VEHICLE

CROSS-REFERENCE TO RELATED APPLICATIONS

The present disclosure relates to subject matter contained in priority Japanese Application No. 2006-302674, filed on Nov. 8, 2006, which is herein expressly incorporated by reference in its entirety.

BACKGROUND OF THE INVENTION

1. Field of the Invention

The present invention relates to a printed circuit board having fuse housings; and an electric junction box for vehicles that houses a printed circuit board having fuse housings. More particularly, output terminals, which project into the fuse housings provided in a plurality of tiers in the electric junction box, include terminals projecting from the printed circuit board housed in the electric junction box; and input terminals include terminals extending from bus bars.

2. Description of Related Art

Japanese Patent Laid-open Publication No. 2006-187052 discloses a conventional electric junction box of such a type, wherein terminals connected to a printed circuit board housed therein project inside a fuse housing. For such an electric junction box, the terminals are fixed to a fuse holder in advance, and the fuse holder to which the terminals are fixed is mounted on the printed circuit board. When mounted on the printed circuit board, the fuse holder is positioned thereon, thereby allowing the terminals fixed to the fuse holder to accurately fit onto and pass through terminal holes in the printed circuit board. The terminals passed through the respective terminal holes are then fixed with soldering, press-fitting, or the like.

Further, when the printed circuit board is positioned horizontally in the electric junction box, and the terminals projecting into the fuse housing project into the fuse housing provided on a side surface of the electric junction box, the terminals are passed through and fixed to the fuse holder, and then are bent orthogonally, so that the other end is connected to the printed circuit board.

When fuse housings are provided in a plurality of tiers, and a fuse is included having an allowable current capacity of 15 A or less, however, it is difficult to form an input terminal of the fuse as a terminal projecting from the printed circuit board, since the current capacity of the terminal connected to the printed circuit board is small. Conversely, when a fuse having greater than 15 A is used, an input terminal, similar to an output terminal, can be formed of a terminal connected to the printed circuit board and project into the fuse housings. As described above, when fuses having different capacities are provided in the fuse housings having a plurality of vertically-stacked tiers, it is difficult to press-fit or insert-form a bus bar terminal, which has a large and complicated shape, into a fuse holder (fuse case) in advance, and then to bend the bus bar to into an L shape.

SUMMARY OF THE INVENTION

The present invention is provided to address the above-described problems. An object of the present invention is to provide a printed circuit board having fuse housings; and an electric junction box that houses the printed circuit board, the printed circuit board allowing the fuse housings to be formed easily, into which terminals connected to the printed circuit board and terminals branching from bus bars project.

To address the above-described problems, a first aspect of the present invention provides a printed circuit board having fuse housings and that is mounted in an electric junction box for a vehicle. The printed circuit board includes a fuse case that has fuse housings provided in a plurality of parallel tiers; output terminals that are formed of L-shaped terminals connected to and projecting from a printed conductor of the printed circuit board, and that project inside each of the fuse housing tiers; input terminals that are formed of L-shaped terminals branching from bus bars, and that project inside at least one of the fuse housing tiers; and a base that is mounted on a rear surface side of the fuse case and that holds the input and output terminals that are passed through the base.

In an electric junction box for vehicles, numerous fuses need to be mounted on a power circuit and a signal circuit for driving. In addition, fuses having different current capacities need to be mixed and mounted including fuses for a high current of 15 A or greater for the power circuit and fuses for a low current of less than 15 A for the signal circuit. Of the plurality of tiers of the fuse housings mounted in the electric junction box according to the present invention, therefore, at least one fuse housing tier is provided with both input and output terminals formed of the terminals connected to the printed conductor of the printed circuit board, and the tier is dedicated to a fuse for the signal circuit. At least one remaining fuse housing tier is provided with an output terminal formed of the terminal connected to the printed conductor of the printed circuit board, and an input terminal formed of the terminal branching from the bus bar; and the tier is dedicated to a fuse for the power circuit. Given the above-described case where the terminals branching from the bus bars may be included and the terminals of the bus bar side may be provided between the terminals of the printed circuit board side, it is not convenient or expedient to attach all the terminals to the fuse case side in advance. As described above, the present invention provides the base, to which all the terminals of the bus bar side and of the printed circuit board side are fixed. The terminals of the printed circuit board side are fixed to the printed circuit board with soldering and the like while being held on the base, and are inserted into each terminal housing of the fuse case. The terminals are passed through terminal holes in the printed circuit board and are fixed thereto with soldering and the like while being fixed to the base in advance, thereby improving the process of inserting the terminals into the terminal holes and of connecting the terminals to the printed conductor. Thus, the present invention is capable of providing in a simple and accurate manner the printed circuit board having the fuse housings, which includes the terminals of the bus bar side and of the printed circuit board side as the input terminals and the terminals connected to the printed conductor of the printed circuit board side as the output terminals.

An aspect of the present invention provides a printed circuit board including a fuse case provided on the printed circuit board, the fuse case including a plurality of fuse housings; a plurality of output terminals projecting from a printed conductor of the printed circuit board, each output terminal including an L-shaped terminal projecting into one of the fuse housings; a plurality of input terminals branching from at least one bus bar, each input terminal including an L-shaped terminal projecting into one of the fuse housings; and a base mounted on a rear surface of the fuse case, the base holding the input and output terminals passing through the base. Further, the plurality of fuse housings may be provided in a plurality of parallel tiers; the output terminals extend inside each of the parallel tiers; and the input terminals extend inside at least one of the parallel tiers. Further, the fuse housings include first to third tiers; the output terminals project into the first to third tiers of the fuse housings, and the input terminal projecting into the first tier of the fuse housing are connected to the printed conductor of the printed circuit board; and the input terminals projecting into the second and third tiers of the fuse housings branch from the bus bars fixed to the printed circuit board. Additionally, the base includes a first base portion and a second base portion, the first base portion having apertures through which the input and output terminals for the first tier and the output terminal for the second tier are passed, the second base portion having an aperture through which the output terminal for the third tier is passed; the input terminal for the second tier branching from the bus bar being held between the first and second base portions; the input terminal for the third tier being passed through a notch provided on an end of the second base portion; and the first and second base portions are integrally combined.

A further aspect of the present invention includes in combination, an electric junction box for a vehicle; a printed circuit board; and the electric junction box including an upper case and a lower case housing the printed circuit board. Further, the fuse case may be provided on a side surface of the printed circuit board and positioned between the upper and lower cases. The electric junction box for a vehicle may further include latch portions provided on the upper and lower cases; and latching hooks projecting from the fuse case and inserted into and engaged with the latch portions provided on the upper and lower cases, so that the fuse case is fixed between the upper and lower cases.

A further aspect of the present invention provides a method of assembling a printed circuit board including providing a fuse case on the printed circuit board, the fuse case including a plurality of fuse housings; providing a plurality of output terminals projecting from a printed conductor of the printed circuit board, each output terminal including an L-shaped terminal projecting into one of the fuse housings; providing a plurality of input terminals branching from at least one bus bar, each input terminal including an L-shaped terminal projecting into one of the fuse housings; and providing a base mounted on a rear surface of the fuse case, the base holding the input and output terminals passing through the base. The method further includes providing the plurality of fuse housings in a plurality of parallel tiers; the output terminals extending inside each of the parallel tiers; and the input terminals extending inside at least one of the parallel tiers.

In a further aspect of the present invention, the method of assembling a printed circuit board includes providing the fuse housings in first to third tiers; the output terminals projecting into the first to third tiers of the fuse housings, and the input terminal projecting into the first tier of the fuse housing are connected to the printed conductor of the printed circuit board; and the input terminals projecting into the second and third tiers of the fuse housings branch from the bus bars fixed to the printed circuit board. The method of assembling a printed circuit board further includes providing the base in a first base portion and a second base portion; passing the input and output terminals for the first tier and the output terminal for the second tier through apertures in the first base portion; holding the input terminal for the second tier branching from the bus bar between the first and second base portions; passing the input terminal for the third tier through a notch provided on an end of the second base portion; and integrally combining the first and second base portions.

In a further aspect of the present invention, the method of assembling a printed circuit board further includes providing an electric junction box including an upper case and a lower case, and housing the printed circuit board between the upper case and the lower case. The method of assembling a printed circuit board may further include providing the fuse case on a side surface of the printed circuit board, and positioning the printed circuit board between the upper and lower cases. The method of assembling a printed circuit board may further include providing latch portions on the upper and lower cases; providing latching hooks projecting from the fuse case; and inserting the latching hooks into the latch portions provided on the upper and lower cases, so that the fuse case is fixed between the upper and lower cases. Further, the method of assembling a printed circuit board may include press fitting and fixing output terminals and an input terminal for the first tier to a first base portion; bending the output terminals and the input terminal fixed to the first base portion; and aligning and mounting an input terminal with a notch on an upper end of the first base portion. The method may further include press fitting and fixing an output terminal for the third tier to a second base portion; aligning and mounting an input terminal for the third tier with a notch provided on an upper end portion of the second base portion; and connecting the second base portion to the upper end of the first base portion. The method may further include passing an end portion of the first base portion through an aperture in the printed circuit board, and positioning the base portion thereon; inserting lower end portions of the terminals through terminal holes in the printed circuit board; and soldering the terminals on a lower surface side of the printed circuit board, so as to connect to a printed conductor of the printed circuit board. The method of assembling a printed circuit board may further include attaching a fuse case to the terminals projecting from the base; and collectively inserting the terminals into the fuse housings.

As described above, the printed circuit board having the fuse housings according to the present invention employs the base, where the mixed terminals of both the printed circuit board and bus bar sides are passed and fixed. Thereby, the respective terminals can be easily and accurately inserted into terminal insertion portions of the fuse case while being integrally combined with the base. In addition, the terminals are bent after being passed through and fixed to the base. Thereby, the terminals of the printed circuit board side can be accurately passed through and connected to the terminal holes.

Further, in the electric junction box that houses the printed circuit board having the fuse housings, when the printed circuit board is placed in the lower and upper cases, the fuse case is sandwiched and fixed between the upper and lower cases, thus easily providing the fuse housings in the electric junction box.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
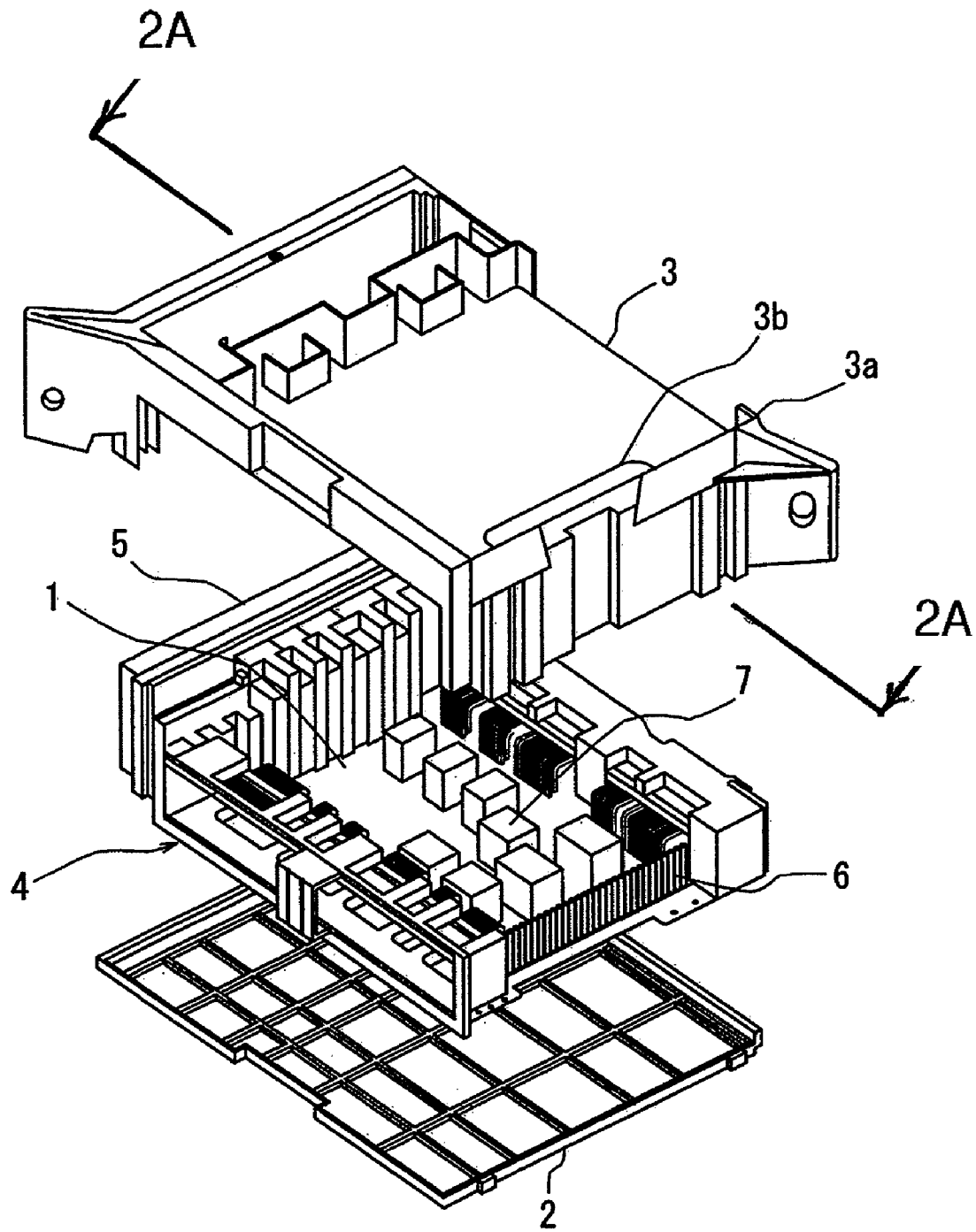
FIG. 1 is an exploded perspective view of an electric junction box according to an embodiment of the present invention.
Figure 2A:
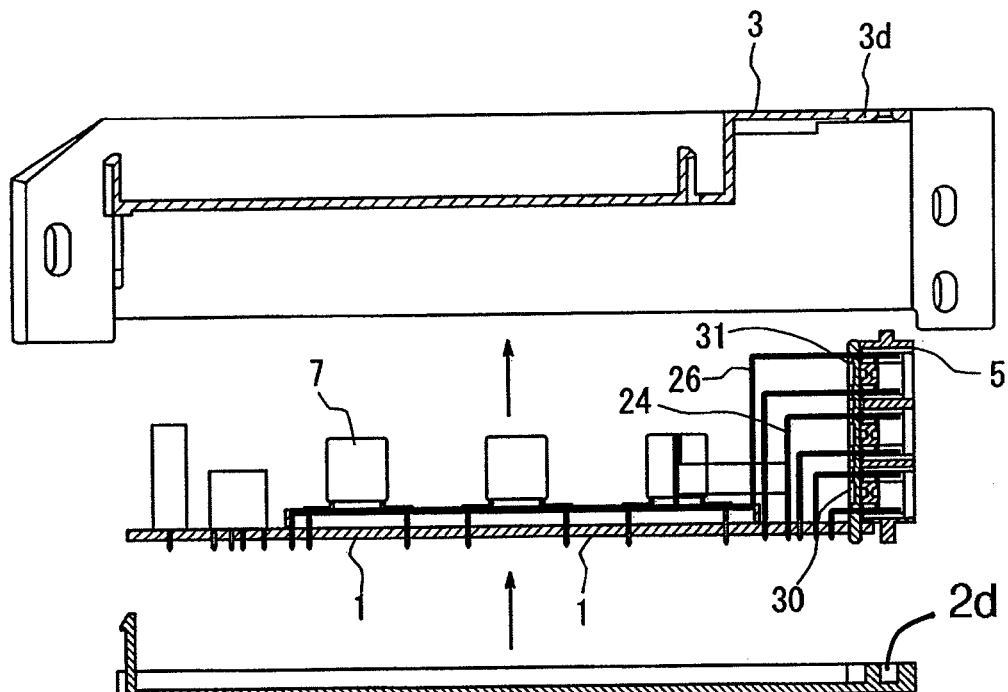
FIG. 2A is a vertical cross-sectional view of taken along line 2-2 of FIG. 1.
Figure 2B:
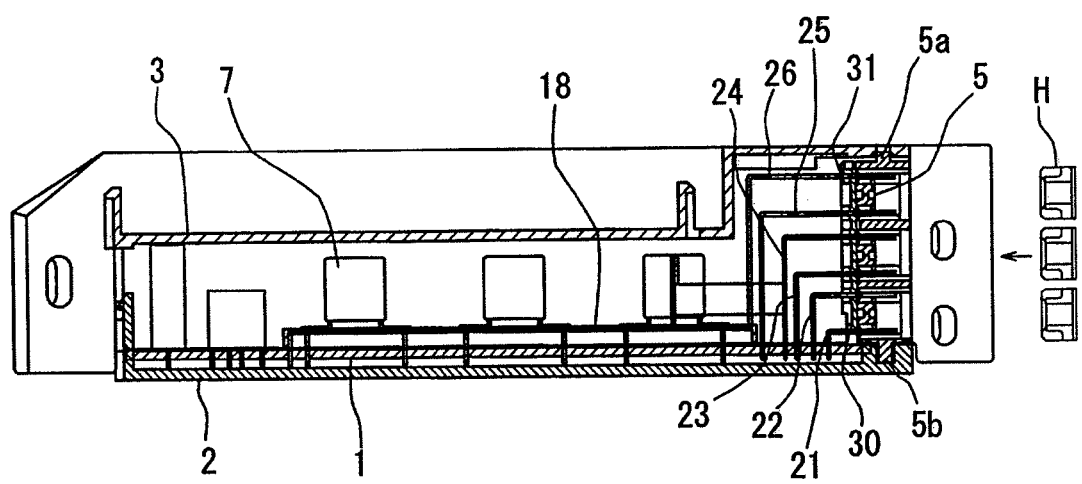
FIG. 2B is a cross-sectional view taken along line 2-2 when the components are mounted.

The embodiment of the present invention is described with reference to FIGS. 1 to 5. FIG. 1 is an exploded perspective view of an electric junction box according to the embodiment. A printed circuit board 1 is housed between a lower case 2 and an upper case 3 in a horizontal orientation and covering substantially the entire area of the cases. A fuse case 5 is provided on a first upper side surface of the printed circuit board 1, the first upper side surface being sandwiched between the lower case 2 and the upper case 3. As shown in FIG. 2A, the fuse case 5 is mounted on an end of the first upper side surface of the printed circuit board 1 in advance while standing vertically, and thus the printed circuit board having the fuse housings is provided.

On the printed circuit board 1, connector housings 4 are provided on both side portions in a direction orthogonal to the fuse case 5. A second upper side surface at the opposite end of the printed circuit board 1 from the fuse case 5 is closed with a side surface 3a of the upper case 3. On an upper surface proximate to the second upper side surface, a connector housing 3b is provided, through which terminals 6 projecting from the printed circuit board 1 extend. Further, a plurality of relays 7 is mounted in a middle region of the printed circuit board 1. As described above, the printed circuit board 1 is mounted with the fuse housings, the connector housings, and the relays in advance.

The fuse case 5 provided on the first upper side surface of the electric junction box, has fuse housings 11, 12, and 13 in vertically positioned first to third tiers. Fuses H having a low height are inserted and connected horizontally to the respective fuse housings 11, 12, 13.

The first tier of the fuse housing 11, which is a bottom tier, is provided on a lower side thereof with insertion of an output terminal 21 of the printed circuit board, and on an upper side thereof with an input terminal 22 of the printed circuit board. The second tier of the fuse housing 12 is provided on a lower side thereof with insertion of an output terminal 23 of the printed circuit board, and on an upper side thereof with an input terminal 24 of a bus bar. The third tier of the fuse housing 13 is provided on a lower side thereof with insertion of an output terminal 25 of the printed circuit board, and on an upper side thereof with an input terminal 26 of the bus bar.

The terminals 21 to 26, which are inserted into the fuse housings 11 to 13, have an L shape. The terminals project vertically upward, as shown in the drawings, from the printed circuit board 1, are bent horizontally at 90 degrees, and are then inserted into the fuse housings 11 to 13. End portions of vertical portions 21a, 22a, 23a, and 25a of the respective terminals 21, 22, 23, and 25 of the printed circuit board, are inserted into terminal holes in a printed conductor provided on an upper surface of the printed circuit board 1, and then soldered and fixed thereto. The input terminals 24 and 26 of the bus bar branch from a first end of bus bars 15 and 16, respectively. Terminals 15a and 16a, which branch from a second end of the bus bars 15 and 16, respectively, are passed through through-holes in the printed circuit board 1, and then soldered and fixed thereto.

The terminals 21 to 26 inserted into the fuse housings 11 to 13 have been previously fixed to a first base portion 30 and a second base portion 31, which are provided on a rear surface of the fuse case 5, and integrally combined with the base.

An assembly method for mounting the first base portion 30, the second base portion 31, the terminals 21 to 26, and the fuse case 5, which are shown in FIG. 2A, on the printed circuit board 1 so as to integrally combine the components, is explained below with reference to FIGS. 3A to 5.

Figure 3A:
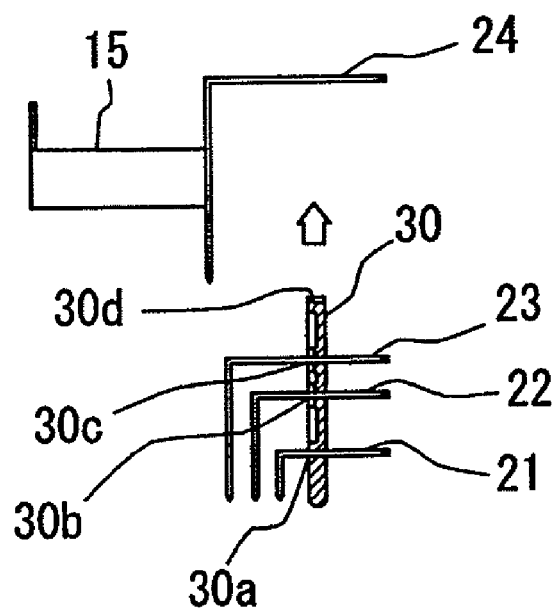
FIG. 3A illustrates terminals of a printed circuit board side passed through and fixed to a first base portion.
Figure 3B:
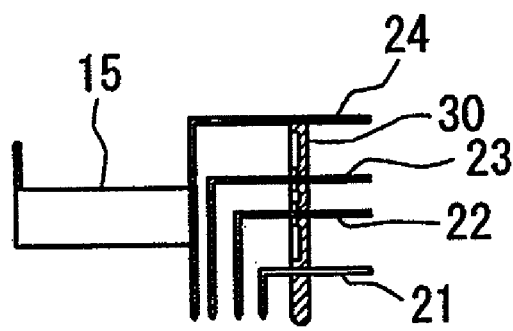
FIG. 3B illustrates terminals of the printed circuit board side passed through and fixed to a first base portion, and with terminals of a bus bar side attached.

First, as shown in FIGS. 3A and 3B, the first base portion 30 has three through-holes or apertures 30a, 30b, and 30c. The output terminal 21, the input terminal 22, and the output terminal 23, which are connected to the printed circuit board 1, are press-fitted and fixed to the apertures 30a, 30b, and 30c respectively, and then bent. The input terminal 24 for the second tier, which branches from the bus bar 15, is aligned with a notch 30d provided on an upper end of the first base portion 30, and then mounted.

Figure 4A:
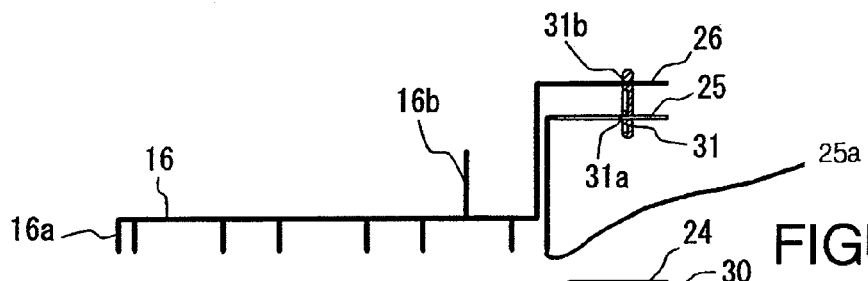
FIG. 4A illustrates the terminals of the printed circuit board side passed through and fixed to a second base portion.

Subsequently, as shown in FIG. 4A, the output terminal 25 for the third tier is press-fitted to the aperture 31a in the second base portion 31; the input terminal 26 for the third tier, which branches from the bus bar 16, is aligned with a notch 31b provided on an upper end portion of the second base portion 31, and mounted thereon. The second base portion 31 is then connected to the upper end of the first base portion 30 as shown in FIG. 4B.

In the condition above, the terminals 21 to 23 of the printed circuit board are passed through and fixed to the apertures in the first base portion 30; the terminal 24 of the bus bar is sandwiched and fixed between the first base portion 30 and the second base portion 31; the terminal 25 of the printed circuit board is passed through and fixed to the aperture in the second base portion 31; the terminal 26 of the bus bar is mounted at the end portion of the second base portion 31. Thereby, the terminals are positioned and fixed in parallel.

Figure 4B:
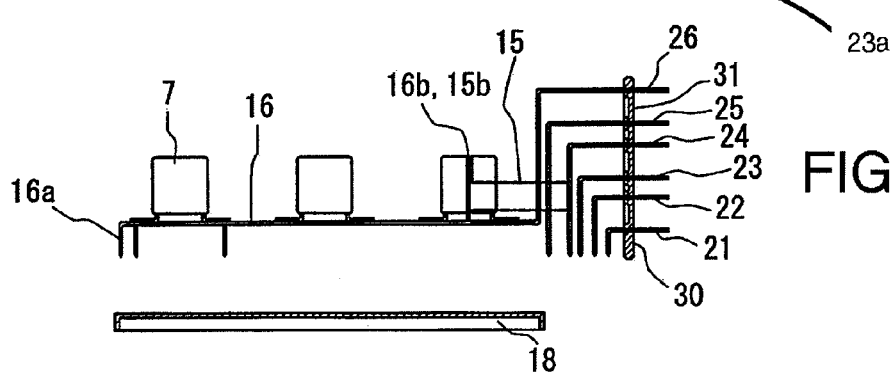
FIG. 4B illustrates the first and second base portions integrally combined.
Figure 4C:
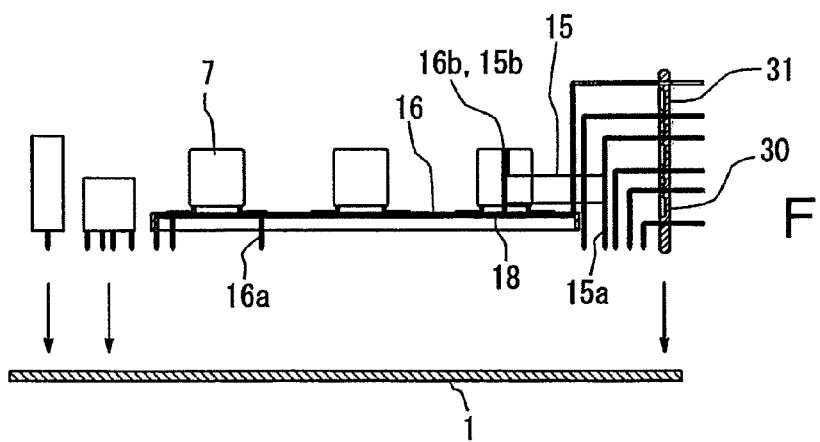
FIG. 4C illustrates mounting of the first and second base portions on the printed circuit board.

Further, input terminals of the relays 7 are welded and mounted on the bus bar 16, from which the terminal 26 branches, as shown in FIG. 4B. Welded portions 15a and 16a provided on the bus bars 15 and 16, respectively are also welded. An insulating board 18 is attached to a lower portion of the bus bar 16, then mounted on the printed circuit board 1, as shown in FIG. 4C, and thereby integrally combined with the printed circuit board 1 as shown in FIG. 5.

Figure 5:
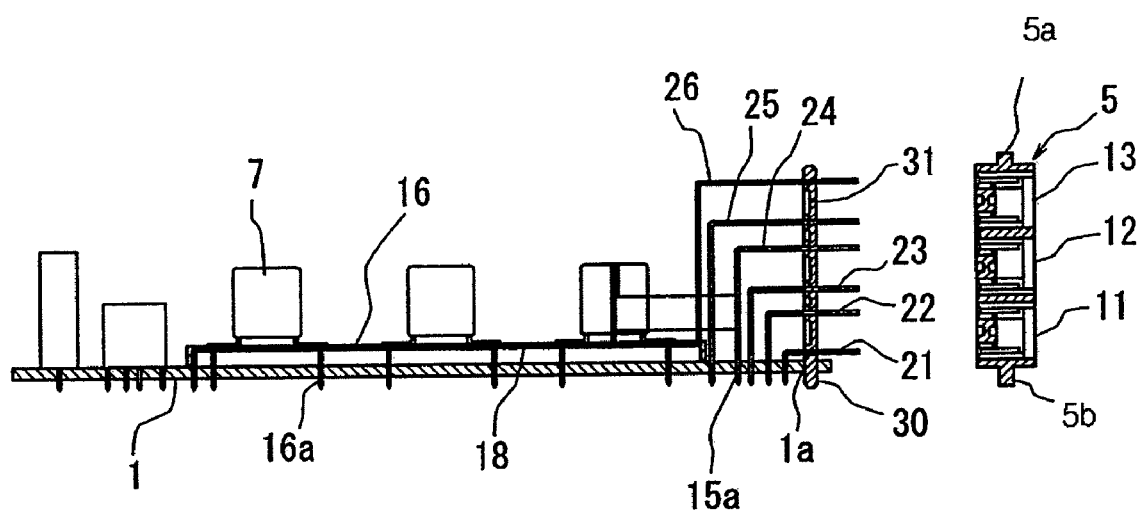
FIG. 5 illustrates mounting a fuse case.

In the process above, the end portion of the first base portion 30 is passed through an aperture 1a, which is provided on the right side (as shown in FIG. 5) of the printed circuit board 1, and positioned thereon. Then, lower end portions of the terminals 21, 22, 23, and 25 of the printed circuit board, which project from the first and second base portions 30 and 31 and bend at 90 degrees, are passed through the terminal holes in the printed circuit board 1. In addition, the terminals 15a and 16a of the bus bars 15 and 16, which have the branching and connecting terminals 24 and 26, are inserted into the apertures in the printed circuit board 1. In the condition above, the terminals 21 to 23, and 25 are soldered on a lower surface side of the printed circuit board 1, so as to connect to the printed conductor of the printed circuit board 1; and the terminals 15a and 16a of the bus bars 15 and 16 having the branching terminals 24 and 26 are also soldered on the lower surface side of the printed circuit board 1 so as to be fixed thereon.

Thereafter, the fuse case 5 is attached to the terminals 21 to 26 projecting from the first base portion 30 and the second base portion 31, and then the terminals 21 to 26 are collectively inserted into the fuse housings 11 to 13.

The printed circuit board 1 having the fuse housings, which are integrally mounted with the first and second base portions 30 and 31, the fuse case 5, and the terminals 21 to 26, are horizontally positioned and housed in the lower case 2 and the upper case 3, as shown in FIG. 2A. A latching hook 5a projects from an upper wall of the fuse case 5, which extends from the end of the upper side surface of the printed circuit board 1, and a latching hook 5b from a lower wall thereof. The latching hooks 5b and 5a are engaged with a latch groove 2d provided on the lower case 2 and a latch groove 3d on the upper case 3, respectively, so as to sandwich and fix the fuse case 5 between the lower case 2 and the upper case 3.

The electric junction box of the present invention has the above-described construction, wherein the printed circuit board 1, on which fuse housings 11, 12, 13 having the plurality of tiers are mounted in advance, is housed in the case that includes the lower case 2 and the upper case 3. Thus, when the printed circuit board 1 is housed in the lower case 2 and the upper case 3, the fuse case 5 provided on the printed circuit board 1 is provided on the upper side surface sandwiched between the lower case 2 and the upper case 3. Thereby, a fuse housing does not need to be provided on the upper case 3 and the lower case 2. In addition, the fuse housings are tightly arranged in three vertical tiers; and the input and output terminals connected to the printed circuit board side and the terminals branching from the bus bars as the input terminals can project into the fuse housings, thus achieving high-density fuse housings for signal and power circuits.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A printed circuit board comprising:
   a fuse case provided on the printed circuit board, said fuse case comprising a plurality of fuse housings;
   a plurality of output terminals projecting from a printed conductor of the printed circuit board, each output terminal comprising an L-shaped terminal projecting into one of said fuse housings;
   a plurality of input terminals branching from at least one bus bar, each input terminal comprising an L-shaped terminal projecting into one of said fuse housings; and
   a base mounted on a rear surface of said fuse case, said base holding said input and output terminals passing through said base.

2. The printed circuit board according to claim 1, said plurality of fuse housings being provided in a plurality of parallel tiers;
   said output terminals extending inside each of said parallel tiers; and
   said input terminals extending inside at least one of said parallel tiers.

3. The printed circuit board according to claim 2,
   said fuse housings comprising first to third tiers;
   said output terminals projecting into the first to third tiers of the fuse housings, and said input terminal projecting into the first tier of the fuse housing are connected to the printed conductor of the printed circuit board; and
   said input terminals projecting into the second and third tiers of the fuse housings branch from the bus bars fixed to the printed circuit board.

4. The printed circuit board according to claim 3,
   said base comprises a first base portion and a second base portion, the first base portion having apertures through which said input and output terminals for the first tier and said output terminal for the second tier are passed, the second base portion having an aperture through which the output terminal for the third tier is passed;
   said input terminal for the second tier branching from the bus bar being held between the first and second base portions;
   said input terminal for the third tier being passed through a notch provided on an end of the second base portion; and
   said first and second base portions are integrally combined.

5. In combination, an electric junction box for a vehicle;
   a printed circuit board according to claim 1; and
   said electric junction box comprising an upper case and a lower case housing the printed circuit board.

6. The electric junction box for a vehicle according to claim 5;
   said fuse case being provided on a side surface of the printed circuit board and being positioned between the upper and lower cases.

7. The electric junction box for a vehicle according to claim 6, further comprising;
   latch portions provided on the upper and lower cases; and
   latching hooks projecting from the fuse case and inserted into and engaged with said latch portions provided on the upper and lower cases, so that the fuse case is fixed between the upper and lower cases.

8. A method of assembling a printed circuit board comprising:
   providing a fuse case on the printed circuit board, said fuse case comprising a plurality of fuse housings;
   providing a plurality of output terminals projecting from a printed conductor of the printed circuit board, each output terminal comprising an L-shaped terminal projecting into one of said fuse housings;
   providing a plurality of input terminals branching from at least one bus bar, each input terminal comprising an L-shaped terminal projecting into one of said fuse housings; and providing a base mounted on a rear surface of said fuse case, said base holding said input and output terminals passing through said base.

9. The method of assembling a printed circuit board according to claim 8, further comprising:
providing said plurality of fuse housings in a plurality of parallel tiers;
said output terminals extending inside each of said parallel tiers; and
said input terminals extending inside at least one of said parallel tiers.

10. The method of assembling a printed circuit board according to claim 9, further comprising:
providing said fuse housings in first to third tiers;
said output terminals projecting into the first to third tiers of the fuse housings, and said input terminal projecting into the first tier of the fuse housing are connected to the printed conductor of the printed circuit board; and
said input terminals projecting into the second and third tiers of the fuse housings branch from the bus bars fixed to the printed circuit board.

11. The method of assembling a printed circuit board according to claim 10, further comprising:
providing said base in a first base portion and a second base portion;
passing said input and output terminals for the first tier and said output terminal for the second tier through apertures in the first base portion;
holding said input terminal for the second tier branching from the bus bar between the first and second base portions;
passing said input terminal for the third tier through a notch provided on an end of the second base portion; and
integrally combining said first and second base portions.

12. The method of assembling a printed circuit board according to claim 8, further comprising:
providing an electric junction box comprising an upper case and a lower case, and housing the printed circuit board between the upper case and the lower case.

13. The method of assembling a printed circuit board according to claim 12, further comprising:
providing said fuse case on a side surface of the printed circuit board, and positioning the printed circuit board between the upper and lower cases.

14. The method of assembling a printed circuit board according to claim 13, further comprising;
providing latch portions on the upper and lower cases;
providing latching hooks projecting from the fuse case; and
inserting said latching hooks into said latch portions provided on the upper and lower cases, so that the fuse case is fixed between the upper and lower cases.

15. The method of assembling a printed circuit board according to claim 8, further comprising:
press fitting and fixing output terminals and an input terminal for the first tier to a first base portion;
bending the output terminals and the input terminal fixed to the first base portion; and
aligning and mounting an input terminal with a notch on an upper end of the first base portion.

16. The method of assembling a printed circuit board according to claim 15, further comprising:
press fitting and fixing an output terminal for the third tier to a second base portion;
aligning and mounting an input terminal for the third tier with a notch provided on an upper end portion of the second base portion; and
connecting the second base portion to the upper end of the first base portion.

17. The method of assembling a printed circuit board according to claim 16, further comprising:
passing an end portion of the first base portion through an aperture in the printed circuit board, and positioning the base portion thereon;
inserting lower end portions of the terminals through terminal holes in the printed circuit board; and
soldering the terminals on a lower surface side of the printed circuit board, so as to connect to a printed conductor of the printed circuit board.

18. The method of assembling a printed circuit board according to claim 17, further comprising:
attaching a fuse case to the terminals projecting from the base; and collectively inserting the terminals into the fuse housings.

* * * * *